United States Patent
Vafi et al.

(10) Patent No.: US 6,642,524 B2
(45) Date of Patent: Nov. 4, 2003

(54) SCINTILLATOR SEALING FOR SOLID STATE X-RAY DETECTOR

(75) Inventors: Habib Vafi, Brookfield, WI (US); David Conrad Neumann, Milwaukee, WI (US); Rowland Frederick Saunders, Hartland, WI (US); Scott William Petrick, Sussex, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 22 days.

(21) Appl. No.: 09/683,497

(22) Filed: Jan. 9, 2002

(65) Prior Publication Data

US 2003/0127600 A1 Jul. 10, 2003

(51) Int. Cl.7 .................................................. G01T 1/24
(52) U.S. Cl. ............................... 250/370.11; 250/370.09
(58) Field of Search ..................... 250/370.11, 370.09

(56) References Cited

U.S. PATENT DOCUMENTS

| | | | | |
|---|---|---|---|---|
| 5,132,539 A | * | 7/1992 | Kwasnick et al. | 250/361 R |
| 5,179,284 A | * | 1/1993 | Kingsley et al. | 250/370.11 |
| 6,025,598 A | * | 2/2000 | Tago | 250/370.01 |
| 6,091,795 A | * | 7/2000 | Schafer et al. | 378/19 |
| 6,146,489 A | * | 11/2000 | Wirth | 156/280 |
| 6,172,371 B1 | * | 1/2001 | DeJule et al. | 250/370.11 |
| 6,278,118 B1 | * | 8/2001 | Homme et al. | 250/370.11 |
| 6,350,990 B1 | * | 2/2002 | Wei et al. | 250/370.11 |
| 2003/0001100 A1 | * | 1/2003 | Dejule | 250/370.11 |

* cited by examiner

*Primary Examiner*—Diego Guiterrez
*Assistant Examiner*—Amy R. Cohen

(57) ABSTRACT

An improved design for a solid state X-ray detector that decreases the amount of moisture diffusion that occurs through seals used to attach a cover to a glass substrate panel, thereby protecting the scintillator from moisture damage. In one embodiment, a second hermetic or semi-hermetic seal is introduced between the scintillator and the outside environment to increase the path moisture must travel to reach the scintillator. In another embodiment, a metal frame, preferably a Kovar® frame, is hermetically or semi-hermetically sealed to the cover and glass substrate panel, thereby decreasing the amount of moisture diffusion through the semi-hermetic seal as compared to the prior art.

23 Claims, 3 Drawing Sheets

SCINTILLATOR SEALING FOR SOLID STATE X-RAY DETECTOR

BACKGROUND OF INVENTION

The present invention relates generally to a solid state X-ray detector and more specifically to an improved scintillator sealing for a solid state X-ray detector.

The X-ray detectors have become essential in medical diagnostic imaging, medical therapy, and various medical testing and material analysis industries. One category of X-ray detectors uses scintillator materials to convert X-ray photons into visible-spectrum photons as part of the energy detection process. These scintillator materials are ionic salts such as CsI, which are hygroscopic. CsI is a crystalline material, with needle-shaped crystals. The crystals are oriented perpendicular to the plane of an adjacent glass substrate panel and act as short optical fibers to ensure that light photons originating in a crystal exit the crystal at its end and into an adjacent photodetector, rather than propagating within the CsI layer. The detector is sealed to prevent moisture from being absorbed into the scintillator. This moisture could adversely affect the crystal structure of the scintillator and degrade the image quality of the image detector. Additionally, the solid state electronics which convert the visible-spectrum photons to electrical signals in the image detector also should be protected from moisture to prevent their corrosion and consequent performance degradation.

A true hermetic seal, allowing effectively zero diffusion of moisture, generally requires an inorganic material such as metal or glass to act as the barrier to moisture. Organic materials, such as epoxy adhesives and sealants, do not offer true hermecity, but rather offer a low diffusion rate of moisture, which is dependent upon their formation, the path length required for moisture to penetrate through diffusion, and the quality of their adhesion to the surfaces they are sealing. Epoxy sealants and adhesives are referred to as semi-hermetic seals.

Current methods used to create a sent-hermetic seal use an epoxy sealant to attach a cover to the top layer of the image detector. The cover consists of a composite structural plate made of graphite fiber cloth in an epoxy matrix, with thin aluminum layers on one or both sides of the fiber cloth. The aluminum layers are positioned adjacent to the detector and provide a hermetic baffler over the detection surface area. This cover is bonded to the glass detector substrate with an epoxy seal, providing a semi-hermetic barrier at each edge of the cover. The X-ray image detector thus consists of a flat panel, with one face sealed by glass, one face sealed by aluminum, and the edges sealed by epoxy. Contained within the cover and detector layer are a scintillator and an Opticlad™ layer. The Opticlad™ layer consists of a plastic backing sheet with a layer of metal (typically silver or gold) and a layer of titanium oxide (TiO) and serves to reflect visible spectrum that would otherwise be wasted back to the diode layer of the detector where it is detected.

As the thickness of the scintillator layer is increased, the area over which the epoxy provides a semi-hermetic layer increases in direct proportion. Since the epoxy seal is not truly hermetic, this increases the probability of penetration by sufficient moisture to damage the detector. Also, application of the epoxy sealant required for a thicker scintillator layer is time-consuming.

It is therefore highly desirable to improve the method for sealing a scintillator for a solid state X-ray detector between the cover and substrate.

SUMMARY OF INVENTION

The present invention proposes several different methods by which to improve the hermetic sealing of the scintillator for a solid state X-ray image detector.

In one embodiment, a portion of the Opticlad™ layer that is free of its TiO coating is extended. The metal outer layer of this portion of the Opticlad™ layer is flexed towards and bonded to the glass substrate panel with an epoxy sealant, thereby creating a second semi-hermetic seal between the scintillator and outside moisture.

In another embodiment, an insulating layer is deposited onto the panel in the area to be used for the seal. Over that, a layer of metal that can be reflowed during laser welding is deposited. The metal layer of the Opticlad™ layer is then laser welded to the metal layer on the top surface of the glass panel, thereby creating a second hermetic seal between the scintillator and outside moisture.

In a third embodiment, a metal frame is fabricated and sealed to the inner aluminum face of the graphite cover. The metal frame, preferably a metal alloy such as Kovar®, has a length and width of the required seal, and of a rectangular section approximately equal to that of the scintillator. The metal frame replaces much of the volume of the epoxy seal, resulting in a smaller cross-sectional area of epoxy for moisture to diffuse through.

In a fourth embodiment, which also utilizes a metal frame, a metal such as nickel or gold that can be easily welded is deposited on the aluminum of the graphite composite cover. The metal frame is then welded or soldered directly to the deposited metal layer to create a cover layer with the metal frame attached, as compared to epoxy seal as in the third embodiment described above. This eliminates approximately one-half of the epoxy as used in the third embodiment, thus again reducing the exposed cross-sectional area of epoxy for moisture to diffuse through.

The fifth embodiment builds upon the principles of the third and fourth embodiments, and adds an insulating layer and metal layer that can be welded or soldered between the metal frame and glass substrate panel as well. In this method, the epoxy seal is completely eliminated, and thus the problem of moisture diffusion is also eliminated.

Other objects and advantages of the present invention will become apparent upon the following detailed description and appended claims, and upon reference to the accompanying drawings.

DETAILED DESCRIPTION

Figure 1:
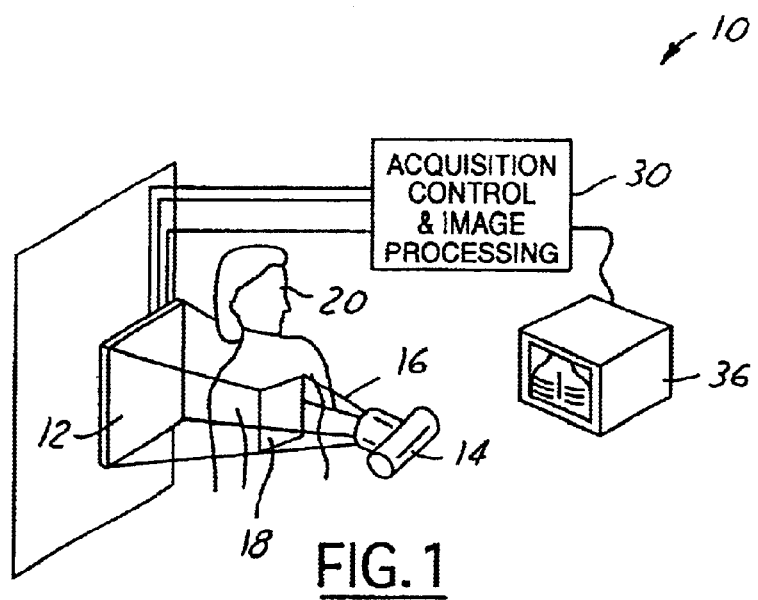
FIG. 1 is a perspective view of a imaging system according to one preferred embodiment of the present invention.

Referring now to FIG. 1, an imaging system 10, for example, an X-ray imaging system, is shown including a photodetector array 12 and an X-ray source 14 collimated to provide an area X-ray beam 16 passing through an area 18 of a patient 20. Beam 16 is attenuated by an internal structure (not shown) of patient 20 to be received by detector array 12 which extends generally over an area in a plane perpendicular to the axis of the X-ray beam 16.

The detector array 12 is preferably fabricated in a solid-state panel configuration having a plurality of detector elements, or pixels (not shown in FIG. 1) arranged in columns or rows. As will be understood by those of ordinary skill in the art, the orientation of the columns and rows is arbitrary; however, for clarity of description, it will be assumed that the rows extend horizontally and the columns extend vertically. Each pixel includes a photosensor, such as a photodiode, that is coupled via a switching transistor (field effect transistor, or FET) to two separate address lines, a scan line and a data line (not shown in FIG. 1). The radiation incident on a scintillator material (shown as 54 in FIGS. 4–8) and the pixel photosensors measure, by way of change in the charge across the photodiode, the amount of light generated by X-ray interaction with the scintillator. As a result, each pixel produces an electrical signal that represents the intensity, after attenuation of patient 20, of an impinging X-ray beam 16.

System 10 also includes an acquisition control and image-processing circuit 30 that is electrically connected to X-ray source 14 and detector array 12. More specifically, circuit 30 controls X-ray source 14, turning it on and off and controlling the tube current and thus the fluence of X-rays in beam 16 and/or the tube voltage and thereby altering the energy of the X-rays in beam 16. In one embodiment, acquisitioning control and image processing circuit 30 includes a data acquisition system (DAS) having at least one DAS module, or circuit (not shown in FIG. 1), which samples data from detector array 12 and transmits the data signals for subsequent processing. Each DAS module can include a plurality of driver channels or a plurality of readout channels. Acquisition control and image processing circuit 30 receives sampled X-ray data from DAS and generates image and displays the image on a monitor, or cathode x-ray tube display 36 based on the data in each pixel.

Figure 2:
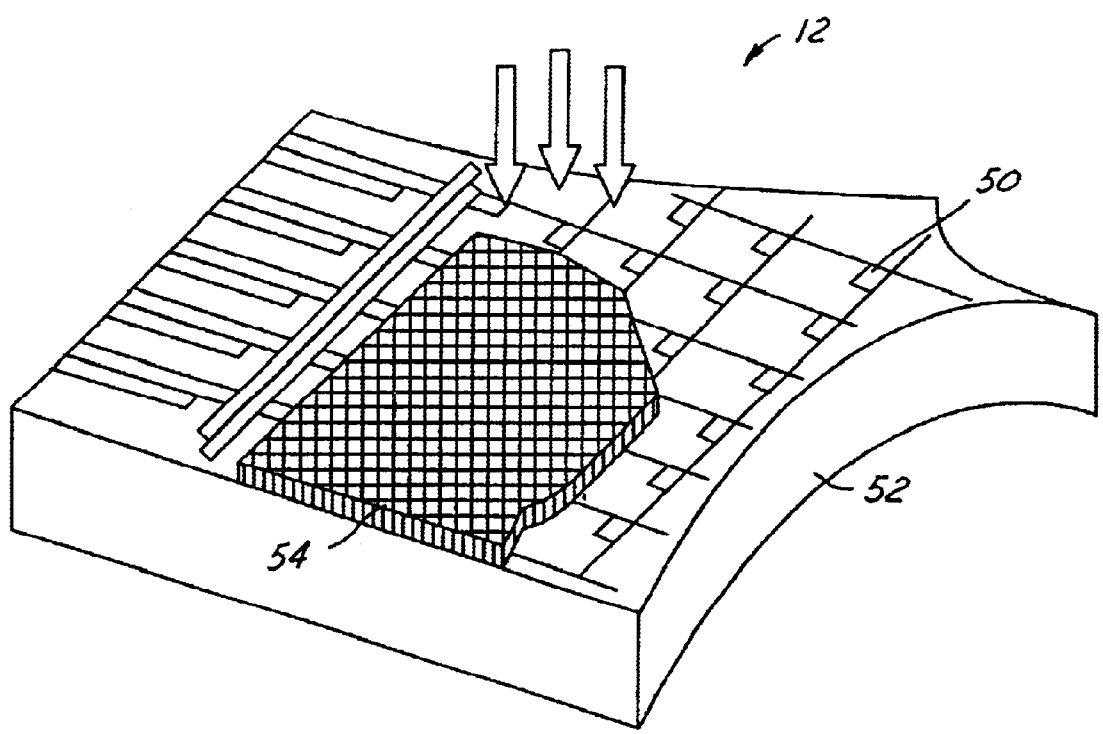
FIG. 2 is a close-up view of a portion of FIG. 1.

As shown in FIG. 2, the photodetector array 12 consists of an amorphous silicon array 50 coupled to a glass substrate panel 52. The amorphous silicon array 50 is comprised of a series of pixels, or detector elements, containing a photosensor and a switching transistor. The pixels produce an electrical signal that represents the intensity, after attenuation, of an impinging X-ray.

Figure 3:
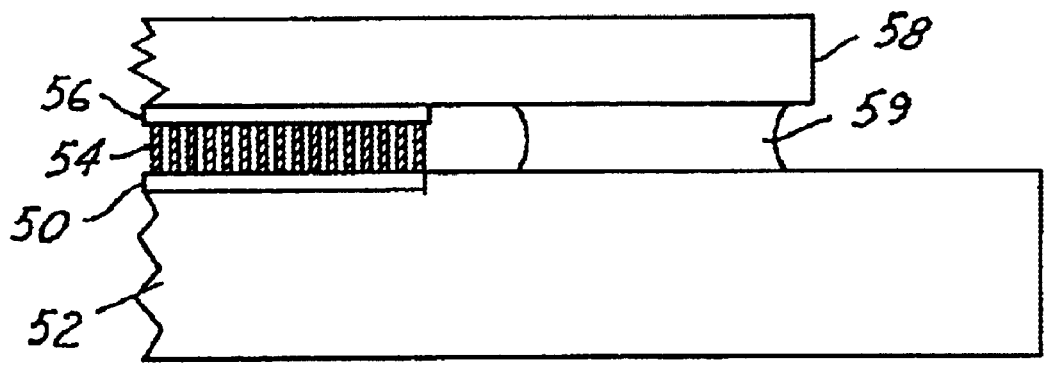
FIG. 3 is a close-up view of the sealing mechanism of the X-ray detector according to the prior art.

A scintillator 54 and Opticlad™ layer (shown as 56 in FIG. 3) are stacked on top of the amorphous silicon array 50 and are contained within a cover (shown as 58 in FIG. 3). The Opticlad™ layer consists of a plastic backing sheet with a layer of metal (typically silver or gold) and a layer of titanium oxide (TiO) and serves to reflect visible spectrum that would otherwise be wasted back to the diode layer of the detector where it is detected. The scintillator 54 materials are ionic salts such as cesium iodide (CsI), which are hygroscopic. CsI is a crystalline material, with needle-shaped crystals. The crystals are oriented perpendicular to the plane of the glass substrate panel 52 and they act as short optical fibers to ensure that light photons originating in the crystals exit at its ends of the crystals and into its amorphous silicon array 50, rather than propagating within the CsI layer. Absorption of moisture into the scintillator 54 will spoil the crystal structure of the CsI and degrade the image quality of the image detector.

The Opticlad™ layer 56 consists of a plastic backing sheet with a layer of metal (typically silver or gold) and a layer of titanium oxide (TiO) and serves to reflect visible spectrum that would otherwise be wasted back to the diode layer of the amorphous silicon array 50 where it is detected.

The cover 58 consists of a composite structural plate made of graphite fiber cloth in an epoxy matrix, with thin aluminum layers on one (inner layer shown as 65 in FIG. 6) or both sides of the graphite fiber cloth.

FIG. 3 illustrates the sealing mechanism for coupling the cover 58 to the glass substrate panel 52 according to the prior art. The cover 58 is sealed to the glass substrate 52 using a polymer sealant, preferably an epoxy sealant 59. Together, the aluminum layers of the cover 58 and the epoxy sealant 59 provide a moisture barrier to protect the scintillator 54 material contained within the cover 58 and glass substrate 52. However, because the epoxy sealant 59 is semi-hermetic, it is possible for a certain amount of moisture to diffuse through the epoxy sealant over time to damage the crystalline structure of the scintillator 54 material. The amount of diffusion of moisture through the sealant is dependent upon numerous factors, including but not limited to the type of polymer material used in the sealant as well as the cross-sectional area of the sealant. Epoxy sealants 59 are preferred for their low diffusion rate.

FIGS. 4–8 illustrate five preferred embodiments of the present invention, in which the hermetic sealing between the cover 58 and glass substrate panel 52 is improved, thereby minimizing or preventing the diffusion of moisture within the cover 58 to damage the scintillator 54.

Figure 4:
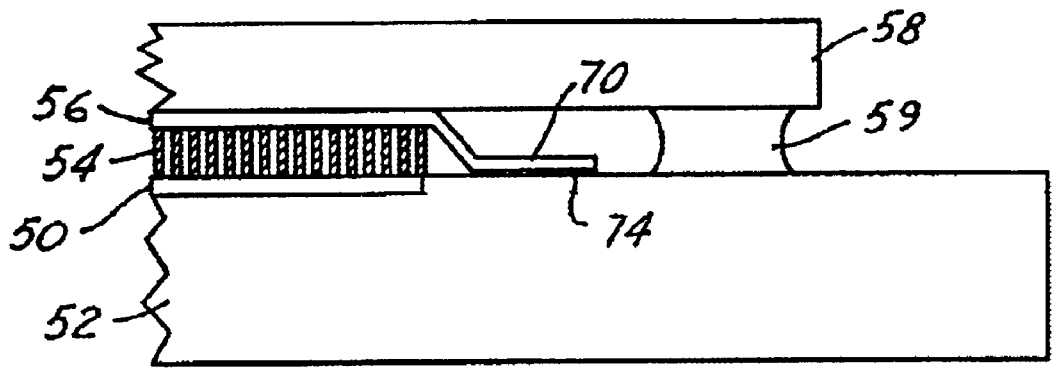
FIG. 4 is a close-up view of the sealing mechanism of the X-ray detector according to one preferred embodiment of the present invention.

In the preferred embodiment as shown in FIG. 4, a portion 70 of the Opticlad™ layer 56 that is free of a TiO coating is flexed and bonded to the surface of the glass substrate panel 52 using an epoxy sealant 74, thereby creating a second semi-hermetic seal between the scintillator 54 and outside moisture.

Figure 5:
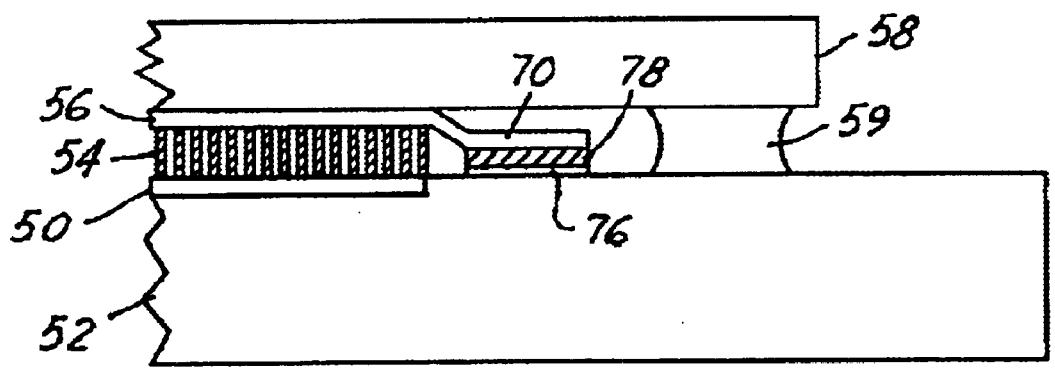
FIG. 5 is a close-up view of the sealing mechanism of the X-ray detector according to another preferred embodiment of the present invention.

In another embodiment, as shown in FIG. 5, an insulating layer 76 is deposited onto the glass substrate panel 52 in the area to be used for the seal. Over that, a layer of metal 78 that can be reflowed during laser welding is then deposited. The portion 70 of the Opticlad layer 56 is then laser welded to the metal layer 78 on the top surface of the glass panel 52, thereby creating a second hermetic seal between the scintillator 54 and outside moisture.

Figure 6:
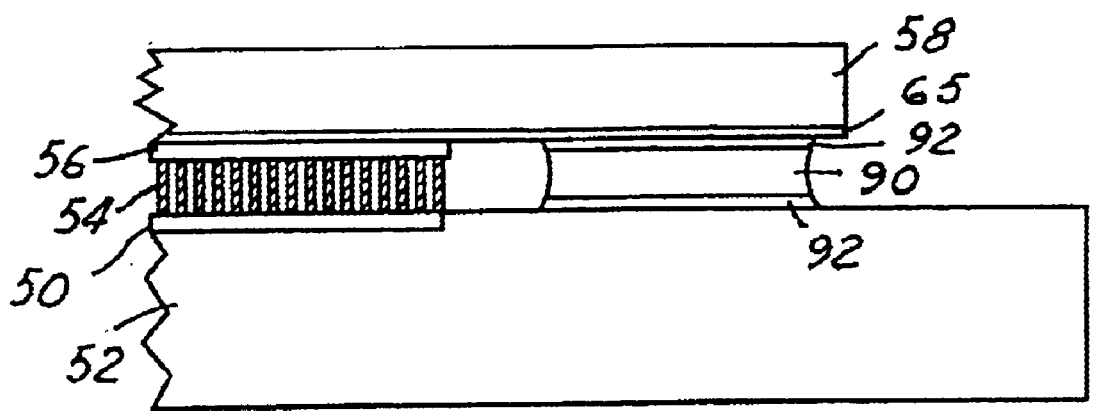
FIG. 6 is a close-up view of the sealing mechanism of the X-ray detector according to another preferred embodiment of the present invention.

In a third embodiment, as shown in FIG. 6, a metal frame 90 of length and width of the required seal, and of a rectangular section approximately equal to that of the scintillator 54, is fabricated and sealed to the inner aluminum face 65 of the cover 58 and to the glass substrate using an epoxy sealant 92. The metal frame 90 thus replaces much of the volume of the epoxy seal, resulting in a smaller cross-sectional area of epoxy sealant 92 for moisture to diffuse through.

Figure 7:
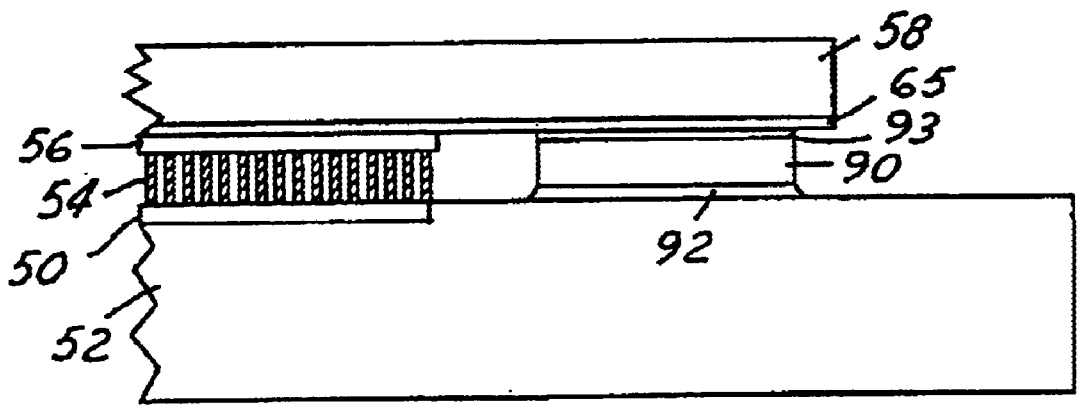
FIG. 7 is a close-up view of the sealing mechanism of the X-ray detector according to another preferred embodiment of the present invention.

In a fourth embodiment, as shown in FIG. 7, which also utilizes the metal frame 90, a metal 93 such as nickel or gold that can be welded or soldered is deposited on the inner aluminum face 65 of the cover 58. The metal frame 90 is then welded or soldered directly to that deposited metal layer 93 to create a cover layer with the metal frame 90 attached, as compared to epoxy seal as in FIG. 6 described above. This eliminates approximately one-half of the epoxy as used in the third embodiment, thus reducing the exposed cross-sectional area of epoxy for moisture to diffuse through.

Figure 8:
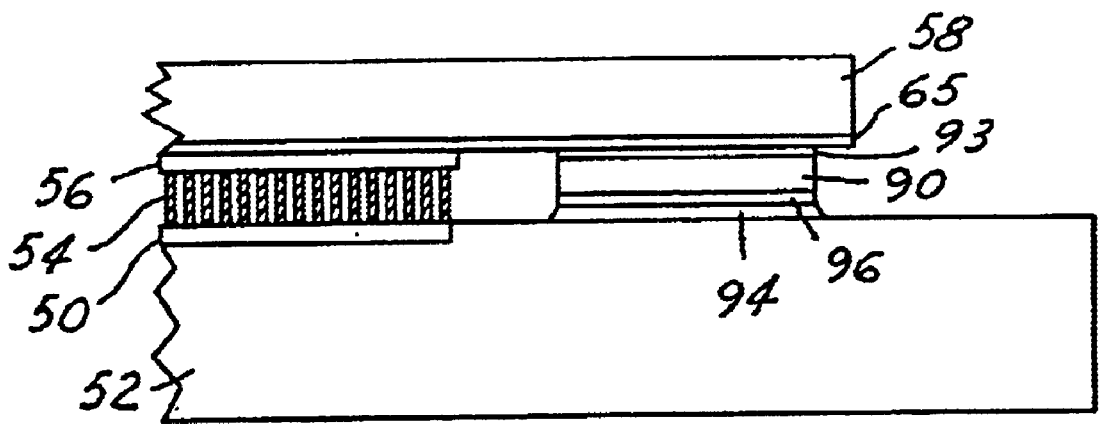
FIG. 8 is a close-up view of the sealing mechanism of the X-ray detector according to another preferred embodiment of the present invention.

The fifth embodiment, as shown in FIG. 8, builds upon the principles of the third and fourth embodiment, and adds an insulating layer 94 and metal layer 96 that can be welded or soldered to the glass substrate panel 52 as well. In this method, the epoxy seal is completely eliminated, and thus the problem of moisture diffusion through the epoxy seal is also eliminated.

The metal used in the metal frames 90 of FIGS. 6–8 should have a similar coefficient of thermal expansion to glass (3.85 ppm/C) to reduce thermal-induced stresses when attached to glass. The metal should also be weldable and solderable. Metal alloys are preferred for this type of application. One preferred metal alloy is Kovar® (5.86 ppm/C), manufactured by Carpenter Technology Corporation. Kovar® is a vacuum formed, iron-nickel-cobalt, low expansion metal alloy material. Of course, other metal alloys having similar physical and thermal attributes may be used in place of the Kovar® in the metal frame 90 as is contemplated in the art.

The hermecity of the sealing within the detector array can be greatly improved by utilizing one of the design techniques disclosed in FIGS. 4–8. These designs minimize or eliminate moisture diffusion through the sealing mechanisms, thereby protecting the scintillator 54 from moisture damage. The methods proposed in FIGS. 4–8 offer simple, inexpensive solutions that can be readily incorporated into known detector designs.

While one particular embodiment of the invention have been shown and described, numerous variations and alternative embodiments will occur to those skilled in the art. Accordingly, it is intended that the invention be limited only in terms of the appended claims.

What is claimed is:

1. A solid state X-ray system having improved hermecity comprising:
   a glass substrate panel;
   an amorphous silicon array coupled to said glass substrate panel;
   a scintillator coupled to said amorphous silicon array;
   an Opticlad™ layer coupled to said scintillator, said Opticlad™ layer comprising a first layer of metal coupled between a plastic backing sheet and a layer of titanium oxide, said Opticlad™ layer having an outer portion without said layer of titanium oxide, said outer portion affixed to said glass substrate panel using a first sealant such that said scintillator is sealed within said outer portion and said glass substrate panel said outer portion comprising said layer of said plastic backing sheet and said layer of said metal; and
   a cover coupled to said Opticlad™ layer and affixed to said glass substrate panel using an epoxy sealant such that said Opticlad™ layer is sealed within said cover and said glass substrate panel.

2. The X-ray system according to claim 1, wherein said first sealant comprises an epoxy sealant.

3. The X-ray system according to claim 1, wherein said first sealant comprises:
   an insulating layer coupled to said glass substrate panel; and
   a second layer of metal coupled to said insulating layer, wherein said second layer of metal is laser welded to and between an outer portion of said Opticlad™ layer and said insulating layer.

4. The solid state X-ray system of claim 3, wherein said insulating material comprises a polyimide material and wherein said metal in said second layer of metal is selected from the group consisting of nickel and gold.

5. A solid state X-ray system having improved hermecity comprising:
   a glass substrate panel;
   an amorphous silicon array coupled to said glass substrate panel;
   a scintillator coupled to said amorphous silicon array;
   an Opticlad™ layer coupled to said scintillator, said Opticlad™ layer comprising a layer of metal coupled between a plastic backing sheet and a layer of titanium oxide;
   a cover coupled to said Opticlad™ layer, said cover having an aluminum inner face; and
   a metal frame affixed to said inner aluminum face of said cover and affixed to said glass substrate panel such that said scintillator is sealed within said cover, said metal frame, and said glass substrate panel.

6. The X-ray system according to claim 5, wherein said metal frame is affixed to said glass substrate panel with an epoxy sealant.

7. The X-ray system according to claim 5, wherein said metal frame is affixed to said inner aluminum face of said cover with an epoxy sealant.

8. The X-ray system according to claim 5, wherein said metal frame is welded to an inner aluminum face of said cover using a metal, said metal selected from the group comprising nickel and gold.

9. The X-ray system according to claim 5, wherein said metal frame is soldered to an inner aluminum face of said cover using a metal, said metal selected from the group comprising nickel and gold.

10. The X-ray system according to claim 5, wherein said metal frame is affixed to said glass substrate panel with a first sealant, wherein said first sealant comprises:
    an insulating layer coupled to said glass panel substrate; and
    a layer of metal coupled to said insulating layer, wherein said layer of metal is laser welded to and between an outer portion of said Opticlad™ layer and said insulating layer.

11. The X-ray system according to claim 5, wherein the composition of a metal used in said metal frame has a coefficient of linear expansion close to that of said glass panel substrate to minimize thermal-induced stresses when said metal frame is affixed to said glass substrate panel.

12. The X-ray system according to claim 5, wherein said metal frame comprises a Kovar® metal alloy frame.

13. A method for reducing or eliminating moisture damage to a scintillator in a solid state X-ray detector, said solid state X-ray detector having a glass substrate panel and a cover, comprising increasing the hermecity of the sealing used to enclose the scintillator within the cover and the glass substrate panel by sealing an outer portion of an Opticlad™ layer to said glass substrate panel such that the scintillator is enclosed within said Opticlad™ layer and the glass substrate panel, wherein said Opticlad™ layer comprises a layer of metal coupled between a plastic backing sheet and a layer of titanium oxide and wherein said outer layer comprises said layer of metal coupled to said plastic backing sheet without said layer of titanium dioxide.

14. The method of claim 13, wherein sealing an outer portion of an Opticlad™ layer to said glass substrate panel comprises affixing an outer portion of an Opticlad™ layer to said glass substrate panel with an epoxy sealant such that the scintillator is enclosed within said Opticlad™ layer and the glass substrate panel.

15. The method of claim 13, wherein sealing an outer portion of an Opticlad™ layer to said glass substrate comprises:

depositing a layer of an insulating material on the glass substrate panel;

depositing a layer of metal on said insulating material; and laser welding said layer of metal to an outer portion of said Opticlad™ layer, wherein the scintillator is enclosed within said Opticlad™ layer and the glass substrate panel.

16. A method for reducing or eliminating moisture damage to a scintillator X-ray detector, said solid state X-ray having a glass substrate panel and a cover, comprising decreasing a surface area of a semi-hermetic seal used to seal the cover to the glass substrate panel by:

providing a metal frame;

affixing said metal frame to an inner aluminum face of the cover; and affixing said metal frame to said glass panel substrate such that the scintillator is enclosed within the cover, said metal frame, and the glass substrate panel.

17. The method of claim 16, wherein affixing said metal frame to the glass panel substrate comprises affixing said metal frame to the glass panel substrate with an epoxy sealant.

18. The method of claim 17, wherein affixing said metal frame to the cover comprises affixing said metal frame to an inner aluminum face of the cover with an epoxy sealant such that the scintillator is enclosed within the cover, said metal frame, and the glass substrate panel.

19. The method of claim 16, wherein affixing said metal frame to the cover comprises welding said metal frame to said aluminum inner face of said cover using a metal, said metal selected from the group comprising nickel and gold.

20. The method of claim 16, wherein affixing said metal frame to the cover comprises soldering said metal frame to said aluminum inner face of said cover using a metal, said metal selected from the group comprising nickel and gold.

21. The method of claim 16, wherein affixing said metal frame to the glass substrate panel comprises affixing said metal frame to the glass substrate panel with a first sealant, wherein said first sealant comprises:

an insulating layer coupled to said glass panel substrate; and a layer of metal coupled to said insulating layer, wherein said layer of metal is laser welded to and between said insulating layer and said metal frame.

22. The method of claim 16, wherein providing a metal frame comprises providing a Kovar® metal alloy frame.

23. The method of claim 16, wherein said metal frame has approximately the same coefficient of linear expansion of said glass substrate panel.

* * * * *